(12) United States Patent
Miyano et al.

(10) Patent No.: US 12,744,075 B2
(45) Date of Patent: Sep. 22, 2026

(54) SEMICONDUCTOR DEVICE WITH COMMANDS DELAYED USING A DELAY LINE

(71) Applicant: MICRON TECHNOLOGY, INC., Boise, ID (US)

(72) Inventors: Kazutaka Miyano, Sagamihara (JP); Yukimi Morimoto, Sagamihara (JP); Yasuo Satoh, Ibaraki (JP); Atsuko Momma, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 190 days.

(21) Appl. No.: 18/780,165

(22) Filed: Jul. 22, 2024

(65) Prior Publication Data

US 2025/0191643 A1 Jun. 12, 2025

Related U.S. Application Data

(60) Provisional application No. 63/606,723, filed on Dec. 6, 2023.

(51) Int. Cl.
*G11C 11/408* (2006.01)
*G11C 11/4078* (2006.01)

(52) U.S. Cl.
CPC ........ *G11C 11/4078* (2013.01); *G11C 11/408* (2013.01)

(58) Field of Classification Search
CPC .............. G11C 11/4078; G11C 11/408; G11C 11/4076; G11C 11/401; G11C 11/409
See application file for complete search history.

(56) References Cited

U.S. PATENT DOCUMENTS 10,572,406 B2 * 2/2020 Oh ...................... G06F 13/1689
2008/0126843 A1 * 5/2008 Nygren ............... G06F 11/1004 714/E11.03
2020/0005856 A1 * 1/2020 Mazumder ........ G11C 11/40615
2020/0136600 A1 * 4/2020 Satoh .................... H03L 7/0816

* cited by examiner

*Primary Examiner* — Jerome Leboeuf
(74) *Attorney, Agent, or Firm* — Dorsey & Whitney LLP

(57) ABSTRACT

An example apparatus includes a first circuit configured to generate a first internal command signal in response to receiving an external command; a second circuit configured to receive the first internal command signal and a degradation control signal to generate a first mixed signal including a first internal command portion and a degradation control signal portion; a third circuit configured to delay the first mixed signal to generate a second mixed signal; and a fourth circuit coupled to the third circuit, the fourth circuit being configured to: receive the second mixed signal; start masking the degradation control signal portion of the second mixed signal at a first timing after the external command is received; and stop masking the degradation control signal portion of the second mixed signal at a second timing after the first internal command portion is generated.

20 Claims, 15 Drawing Sheets

SEMICONDUCTOR DEVICE WITH COMMANDS DELAYED USING A DELAY LINE

CROSS REFERENCE TO RELATED APPLICATION(S)

This application claims priority to U.S. Provisional Application No. 63/606,723, filed Dec. 6, 2023. The aforementioned application is incorporated herein by reference, in its entirety, for any purpose.

BACKGROUND

In a semiconductor device such as a DRAM, when a P-channel MOS transistor is kept on for a long time, a phenomenon called NBTI (Negative Bias Temperature Instability) occurs and causes a threshold voltage to be higher than a designed value. In order to reduce NBTI, a toggle pattern may be transmitted to command wiring in a period in which no command is generated.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
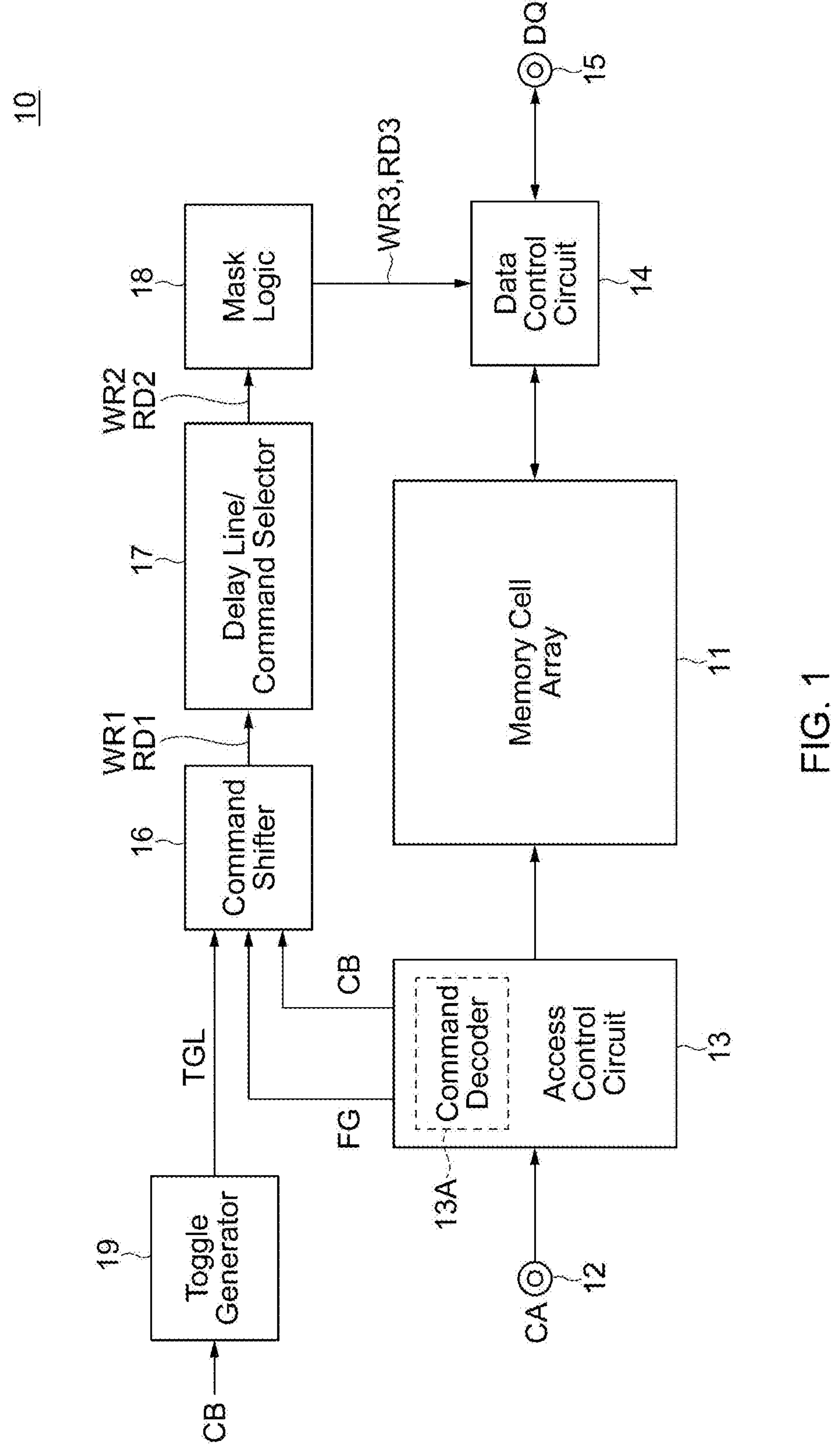
FIG. 1 is a block diagram showing a configuration of a semiconductor device according to an embodiment of the present disclosure.

FIG. 1 is a block diagram showing a configuration of a semiconductor device 10 according to an embodiment of the present disclosure. The semiconductor device 10 shown in FIG. 1 is, for example, a DRAM and includes a memory cell array 11. When the memory cell array 11 is to be accessed, a command address signal CA is input from outside to a command address terminal 12. The command address signal CA is supplied to an access control circuit 13. The access control circuit 13 includes a command decoder 13A. In a case where a command included in the command address signal CA indicates a read operation, the access control circuit 13 makes read-access to a memory cell included in the memory cell array 11 based on an address included in the command address signal CA. A read data DQ read out from the memory cell thus accessed is output to the outside from a data I/O terminal 15 via a data control circuit 14. In a case where the command included in the command address signal CA indicates a write operation, a write data DQ input from the outside to the data I/O terminal 15 is transferred to the memory cell array 11 via the data control circuit 14. The write data DQ transferred to the memory cell array 11 is written to a memory cell included in the memory cell array 11 based on the address included in the command address signal CA.

Figure 2:
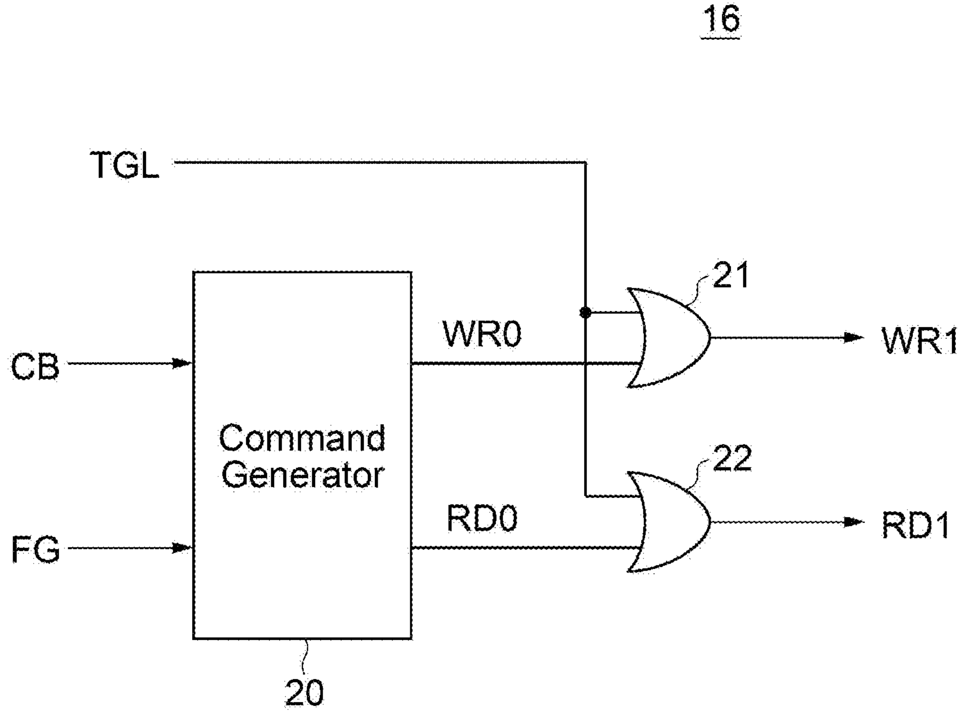
FIG. 2 is a block diagram showing a configuration of a command shifter.

In a case where the command included in the command address signal CA indicates a read operation or a write operation, the command decoder 13A included in the access control circuit 13 activates a command burst signal CB. That is, the command burst signal CB does not include information for determining whether the command included in the command address signal CA is a read command or a write command. The information for determining whether the command is a read command or a write command is indicated by a flag FG generated later than the command burst signal CB. The command burst signal CB and the flag FG are supplied to a command shifter 16. As shown in FIG. 2, the command shifter 16 includes a command generation circuit 20 that generates a write command signal WR0 or a read command signal RD0 based on the command burst signal CB and the flag FG. The command shifter 16 further includes a gate circuit 21 that mixes the write command signal WR0 and a toggle pattern signal TGL together and a gate circuit 22 that mixes the read command signal RD0 and the toggle pattern signal TGL together. In some examples, the toggle pattern signal TGL may be understood as a degradation control signal. In other examples, a toggle pattern may be understood as a dummy pattern. The toggle pattern signal TGL is generated by a toggle generation circuit 19 shown in FIG. 1 so as to be brought into an active state where a high level and a low level are alternatively repeated in a case where the command burst signal CB is in an inactive state and so as to be bought into an inactive state (at a low level) in a case where the command burst signal CB is in an active state. Consequently, a write command signal WR1 output from the command shifter 16 becomes a signal including not only the write command signal WR0 activated to be at a high level but also the toggle pattern signal TGL that alternately repeats a high level and a low level at other timings. A read command signal RD1 output from the command shifter 16 becomes a signal including not only the read command signal RD0 activated to be at a high level but also the toggle pattern signal TGL that alternately repeats a high level and a low level at other timings. Due to contribution of the toggle pattern signal TGL, NBTI in a P-channel MOS transistor included in a transmission path of an internal command signal can be reduced. The toggle generation circuit 19 is brought into an active state again at a timing after a predetermined delay time DO (see FIG. 10A) has elapsed after a portion of the write command signal WR0 or the read command signal RD0 in the write command signal WR1 or the read command signal RD1 becomes inactive. The delay time DO has a sufficient length so as to prevent the active state of the toggle pattern signal TGL from interfering with the write command signal WR0 or the read command signal RD0.

The write command signal WR1 and the read command signal RD1 are supplied to a delay line/command selector 17. The delay line/command selector 17 provides a predetermine delay necessary for execution of write control and execution of read control to the write command signal WR1 and the read command signal RD1, thereby generating a write command signal WR2 and a read command signal RD2, respectively. Both these signals include the toggle pattern signal TGL, and therefore NBTI in the delay line/command selector 17 is reduced. Subsequently, the write command signal WR2 and the read command signal RD2 are supplied to a mask logic 18. The mask logic 18 partially masks the write command signal WR2 and the read command signal RD2 to generate a write command signal WR3 and a read command signal RD3 from which the toggle pattern signal TGL has been removed. This removal is performed because, if the toggle pattern signal TGL that is in an active state is input to a control circuit as it is, it causes a malfunction. The write command signal WR3 and the read command signal RD3 are supplied to the data control circuit 14. The data control circuit 14 fetches the write data DQ in synchronization with the write command signal WR3 or changes a terminator resistance value of the data I/O terminal 15 in synchronization with the write command signal WR3. The data control circuit 14 outputs the read data DQ in synchronization with the read command signal RD3 in a read operation.

Figure 3:
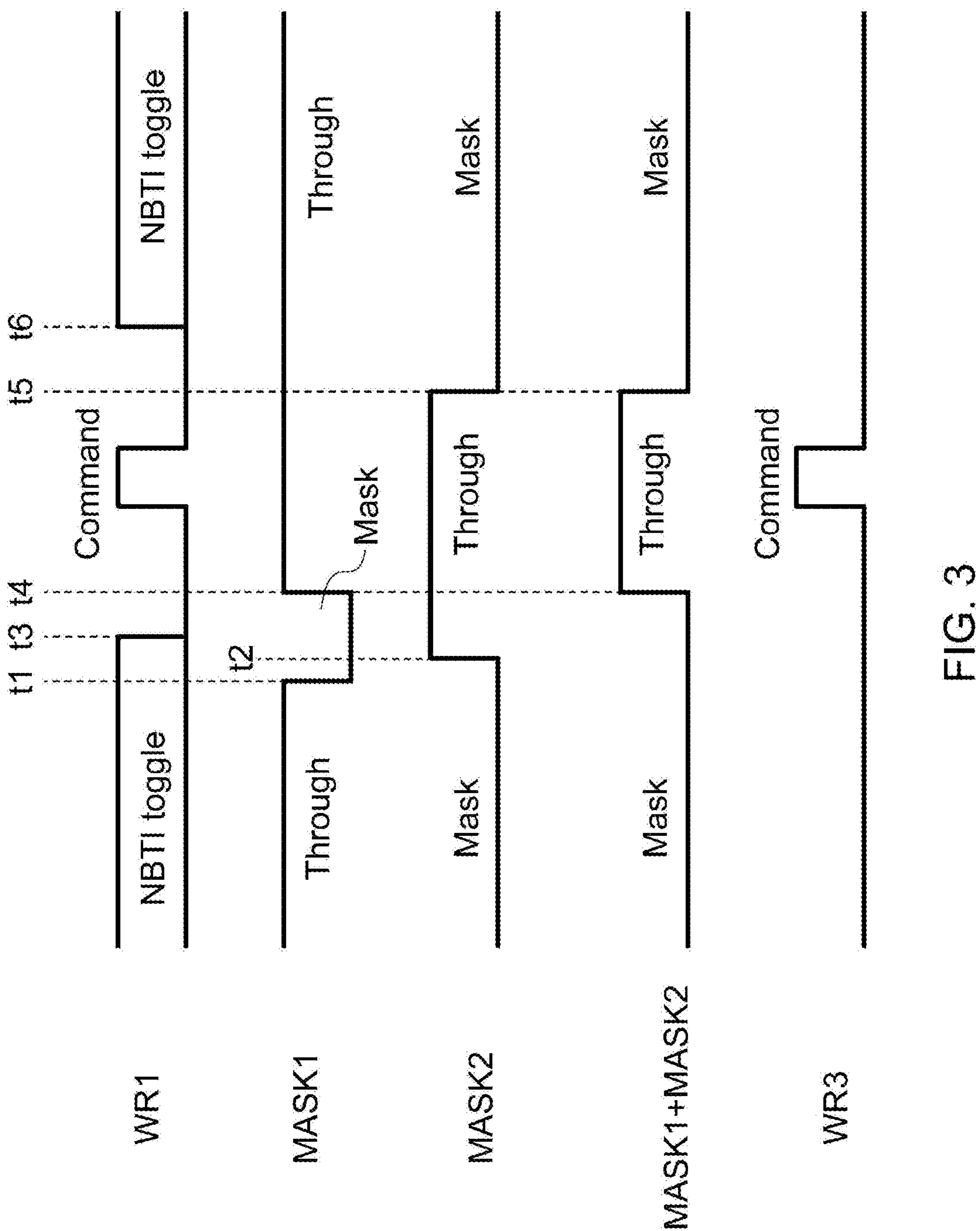
FIG. 3 is a schematic timing chart for explaining a method of removing a toggle pattern.

FIG. 3 is a schematic timing chart for explaining a method of removing the toggle pattern signal TGL.

In the example shown in FIG. 3, the toggle pattern signal TGL is present on a command path for transmitting the write command signal WR1 before a time t3 and after a time t6. A pulse of the write command signal WR1 caused by the command burst signal CB is present between the time t3 and the time t6. In the present embodiment, the toggle pattern signal TGL present before and after the pulse of the write command signal WR1 caused by the command burst signal CB is removed by a two-step masking operation. The first step is a masking operation using a mask signal MASK1 and is performed in the delay line/command selector 17. The second step is a masking operation using a mask signal MASK2 and is performed in the mask logic 18.

The mask signal MASK1 performs a masking operation during a period from a time t1 earlier than the time t3 to a time 14 later than the time t3. During another period, a transmitted signal is passed through. Accordingly, the toggle pattern signal TGL during the period from the time t1 to the time t3 is removed. The mask signal MASK2 performs a passing-through operation during a period from a time t2 between the time t1 and the time 14 to a time t5 earlier than the time t6. During another period, the transmitted signal is masked. Accordingly, the toggle pattern signal TGL during a period before the time t2 and a period after the time t5 is removed. As a result, as shown with MASK1+MASK2 in FIG. 3, the toggle pattern signal TGL during a period before the time t4 and during a period after the time t5 is removed, and only the transmitted signal appearing during a period from the time t4 to the time t5 is passed through. Consequently, the write command signal WR3 from which the toggle pattern signal TGL has been removed is output from the mask logic 18. Here, since the masking operation at the first step is performed in the period from the time t1 to the time t4, a sufficient margin is secured with regard to the time t2 at which the masking operation at the second step is released. Therefore, the time t2 may be earlier than the time t3 or later than the time t3.

A more specific configuration and operation of the semiconductor device 10 are described in detail below.

Figure 4:
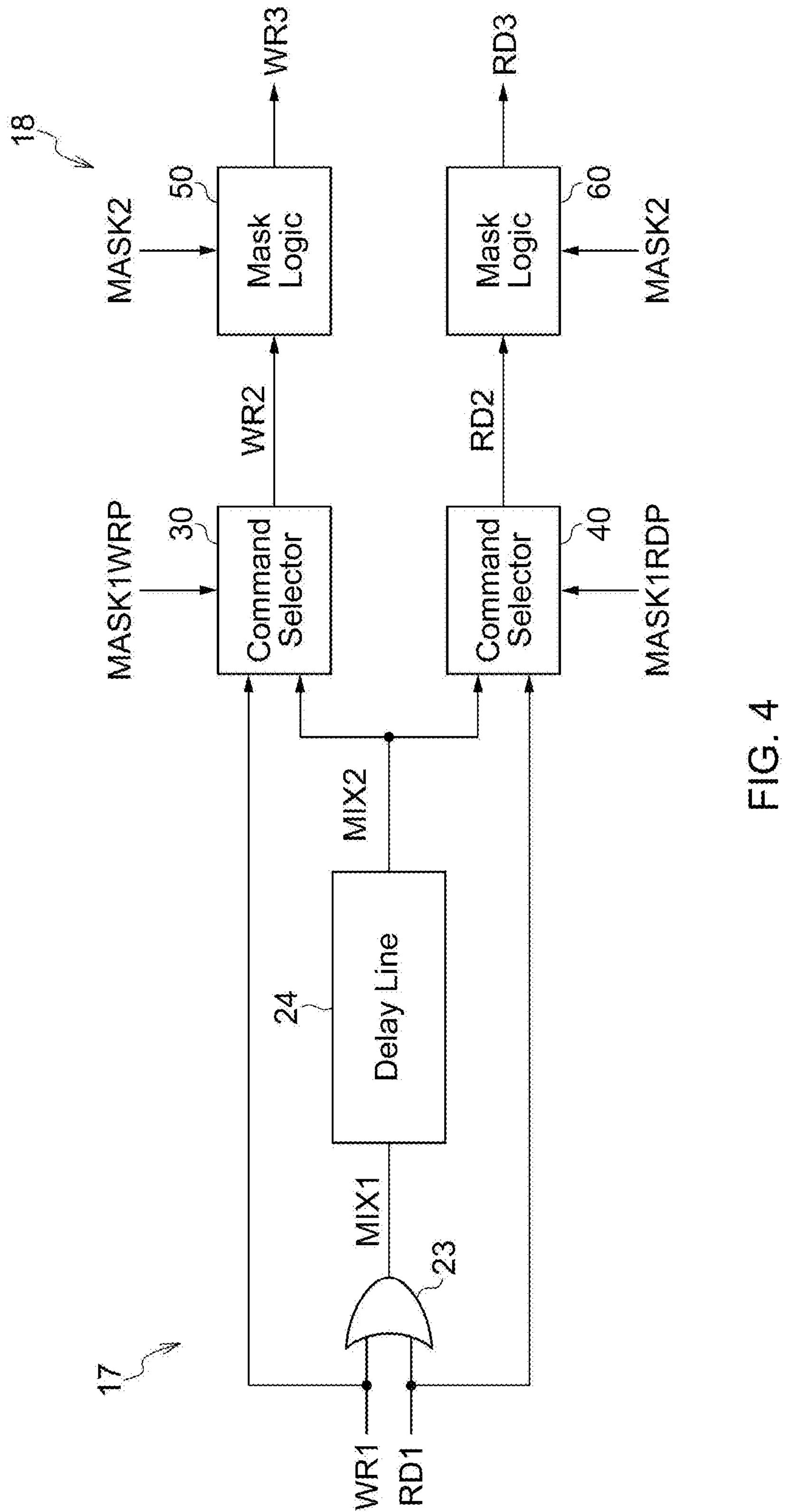
FIG. 4 is a block diagram showing a configuration of a delay line/command selector and a mask logic.

FIG. 4 is a block diagram showing a configuration of the delay line/command selector 17 and the mask logic 18. As shown in FIG. 4, the delay line/command selector 17 includes a gate circuit 23 that mixes the write command signal WR1 and the read command signal RD1 together to generate a mixed command signal MIX1, and a delay line 24 that delays the mixed command signal MIX1 to generate a mixed command signal MIX2. Use of the delay line 24 common to the write command signal WR1 and the read command signal RD1 can reduce the circuit scale. The mixed command signal MIX2 is supplied to command selectors 30 and 40 in common. The command selector 30 generates the write command signal WR2 if the mixed command signal MIX2 is caused by the write command signal WR1. The command selector 40 generates the read command signal RD2 if the mixed command signal MIX2 is caused by the read command signal RD1. That is, the write command signal WR1 and the read command signal RD1 that have been mixed together are separated into the write command signal WR2 and the read command signal RD2 by the command selectors 30 and 40. The command selectors 30 and 40 also perform the masking operation at the first step shown in FIG. 3. The write command signal WR2 and the read command signal RD2 are supplied to mask logics 50 and 60, respectively. The mask logic 50 removes the toggle pattern signal TGL included in the write command signal WR2 to generate the write command signal WR3. The mask logic 60 removes the toggle pattern signal TGL included in the read command signal RD2 to generate the read command signal RD3. The mask logics 50 and 60 perform the masking operation at the second step shown in FIG. 3. Since the delay amount of the delay line 24 is variable, the masking operation at the first step and the masking operation at the second step are performed with a command used as a starting point in the present embodiment.

Figure 5A:
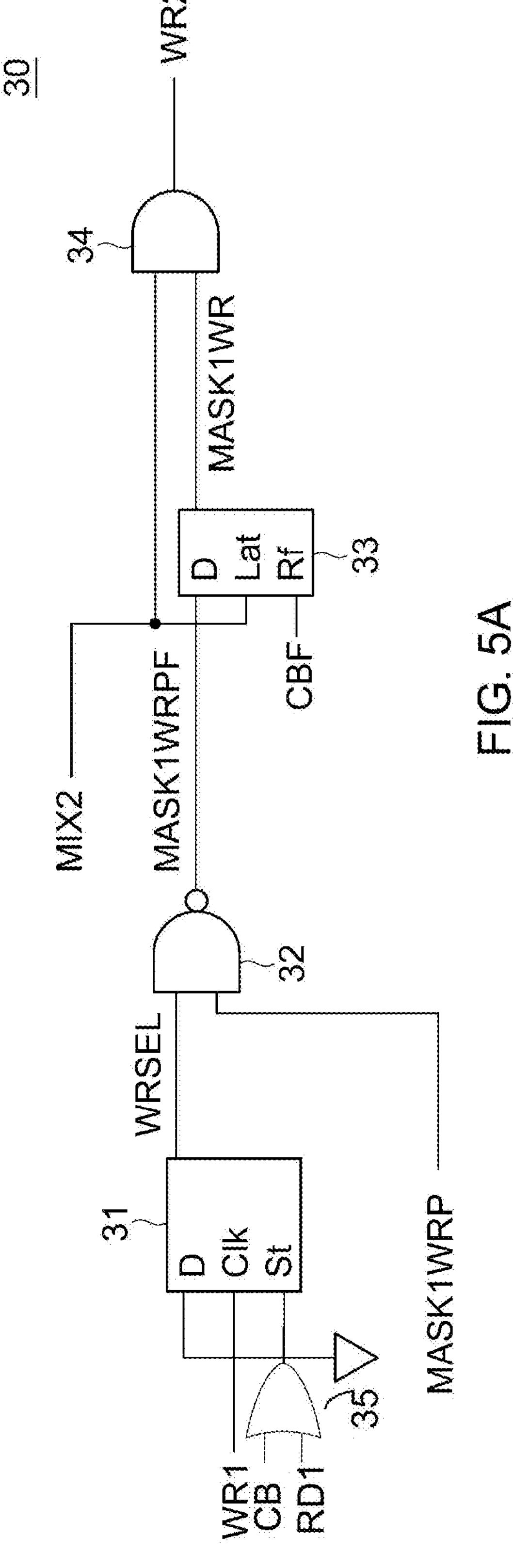
FIGS. 5A and 5B are circuit diagrams of a command selector.

FIG. 5A is a circuit diagram of the command selector 30. As shown in FIG. 5A, the command selector 30 includes a gate circuit 35 configured to receive a command burst signal CB and the read command signal RD1. The command selector further includes a flip flop circuit 31 that is set in response to an active output signal received from the gate circuit 35, for example, when either the command burst signal CB or the read command signal RD1 is active. The flip flop circuit 31 is reset in response to the write command signal WR1, a latch circuit 33 that is reset in response to an inverted signal CBF of the command burst signal CB and is set in response to the mixed command signal MIX2, and gate circuits 32 and 34. A write selection signal WRSEL output from the flip flop circuit 31 turns to be at a high level in response to the command burst signal CB and then changes to be at a low level in response to the write command signal WR1. Thereafter, when the next command burst signal CB is activated, the write selection signal WRSEL is returned to be at a high level again. The write selection signal WRSEL is supplied to one of input nodes of the gate circuit 32. A mask signal MASK1WRP is supplied to the other input node of the gate circuit 32.

Figure 6A:
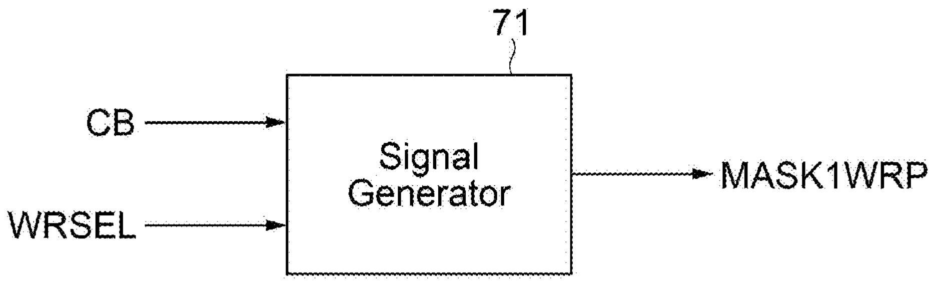
FIGS. 6A, 7A, and 9A are block diagrams of a signal generation circuit that generates a mask signal.
Figure 6B:
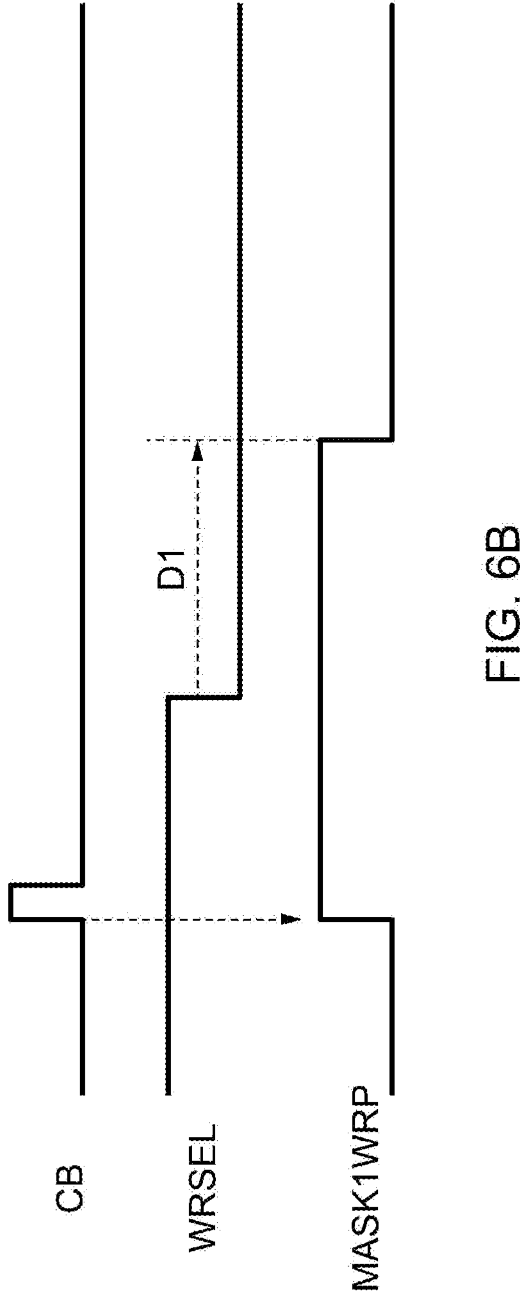
FIGS. 6B, 7B, and 9B are timing charts for explaining the operation of the signal generation circuit.

FIG. 6A is a block diagram of a signal generation circuit 71 that generates the mask signal MASK1WRP. FIG. 6B is a timing chart for explaining the operation of the signal generation circuit 71. As shown in FIG. 6A, the signal generation circuit 71 generates the mask signal MASK1WRP based on the command burst signal CB and the write selection signal WRSEL. As shown in FIG. 6B, the mask signal MASK1WRP changes to be at a high level in response to activation of the command burst signal CB. The mask signal MASK1WRP then changes to be at a low level at a timing at which a predetermined delay time D1 has elapsed after change of the write selection signal WRSEL from a high level to a low level.

The gate circuit 32 is a NAND circuit and, in a case where both the write selection signal WRSEL and the mask signal MASK1WRP are at a high level, places a mask signal MASK1WRPF at a low level. The mask signal MASK1WRPF is supplied to a data input node of the latch circuit 33. Accordingly, a mask signal MASK1WR output from the latch circuit 33 basically has the same waveform as the mask signal MASK1WRPF. To a latch node (Lat) of the latch circuit 33, the mixed command signal MIX2 is input. Because of this input, change of the mask signal MASK1WR in a case where a command pulse caused by the command burst signal CB appears in the mixed command signal MIX2 is prevented. The mask signal MASK1WR is supplied to one of input nodes of the gate circuit 34. The mixed command signal MIX2 is supplied to the other input node of the gate circuit 34. The gate circuit 34 is an AND circuit and, in a case where the mask signal MASK1WR is at a high level, allows the mixed command signal MIX2 to pass therethrough to output it as the write command signal WR2. In a case where the mask signal MASK1WR is at a low level, a signal obtained by masking the mixed command signal MIX2 is output as the write command signal WR2.

Figure 5B:
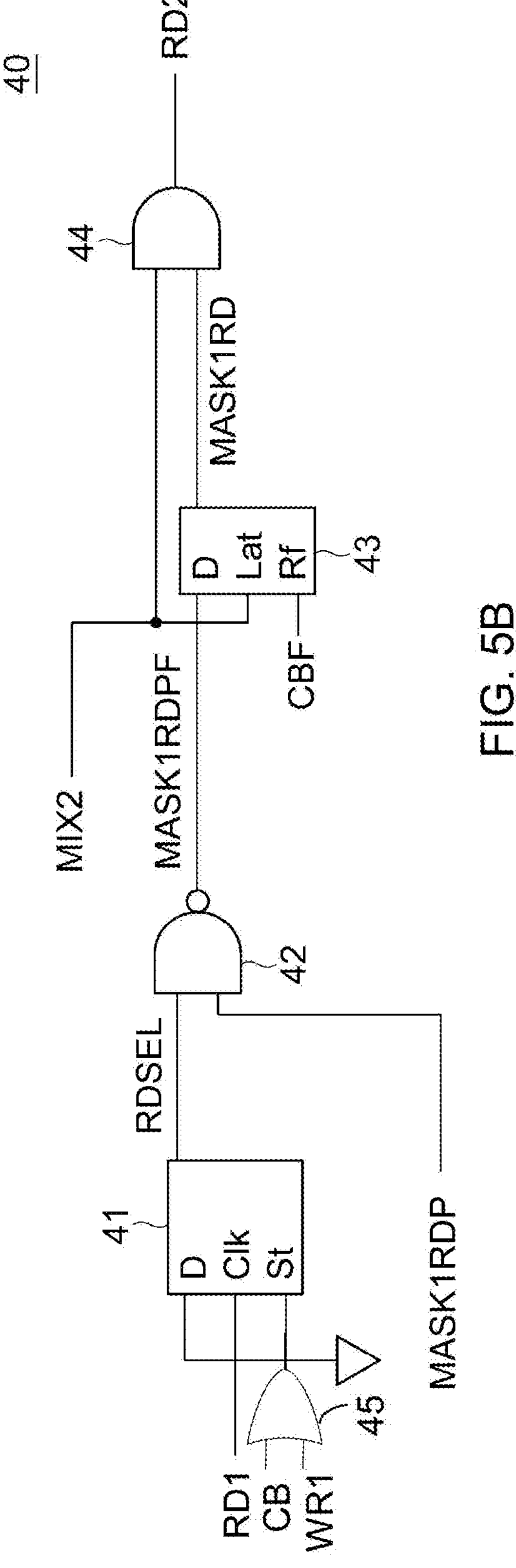

FIG. 5B is a circuit diagram of the command selector 40. As shown in FIG. 5B, the command selector 40 has a circuit configuration identical to that of the command selector 30 shown in FIG. 5A. The read command signal RD1 is supplied to a flip flop circuit 41, and a read selection signal RDSEL is generated in response thereto. A gate circuit 45 configured to receive the command burst signal CB and the write command signal WR1 is configured to provide an output signal to the flip flop circuit 41. The flip flop circuit 41 is set in response to an active output signal received from the gate circuit 45, for example, when either the command burst signal CB or the write command signal WR1 is active. The flip flop circuit 41 is reset in response to the read command signal RD1. The read selection signal RDSEL is supplied to one of input nodes of a gate circuit 42. A mask signal MASK1RDP is supplied to the other input node of the gate circuit 42.

Figure 7A:
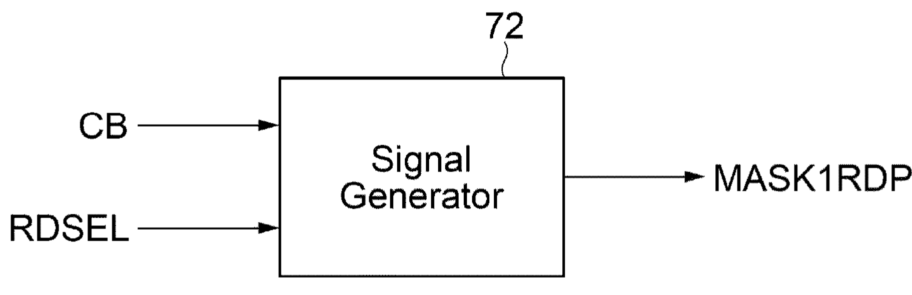
Figure 7B:
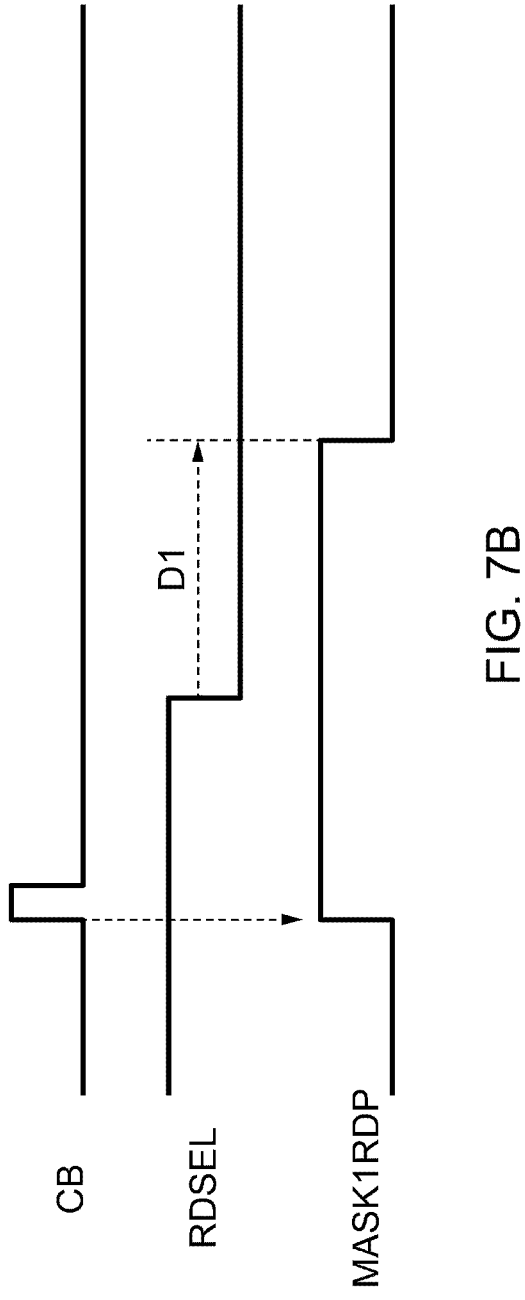

FIG. 7A is a block diagram of a signal generation circuit 72 that generates the mask signal MASK1RDP. FIG. 7B is a timing chart for explaining the operation of the signal generation circuit 72. As shown in FIG. 7A, the signal generation circuit 72 generates the mask signal MASK1RDP based on the command burst signal CB and the read selection signal RDSEL. As shown in FIG. 7B, the mask signal MASK1RDP changes to be at a high level in response to activation of the command burst signal CB. The mask signal MASK1RDP then changes to be at a low level at a timing at which the predetermined delay time D1 has elapsed after change of the read selection signal RDSEL from a high level to a low level.

The gate circuit 42 is a NAND circuit and, in a case where both the read selection signal RDSEL and the mask signal MASK1RDP are at a high level, places a mask signal MASK1RDPF at a low level. The mask signal MASK1RDPF is supplied to a data input node of a latch circuit 43. Accordingly, a mask signal MASK1RD output from the latch circuit 43 basically has the same waveform as the mask signal MASK1RDPF. The mask signal MASK1RD is supplied to one of input nodes of a gate circuit 44. The mixed command signal MIX2 is supplied to the other input node of the gate circuit 44. The gate circuit 44 is an AND circuit and, in a case where the mask signal MASK1RD is at a high level, allows the mixed command signal MIX2 to pass therethrough to output it as the read command signal RD2. In a case where the mask signal MASK1RD is at a low level, a signal obtained by masking the mixed command signal MIX2 is output as the read command signal RD2.

Figure 8A:
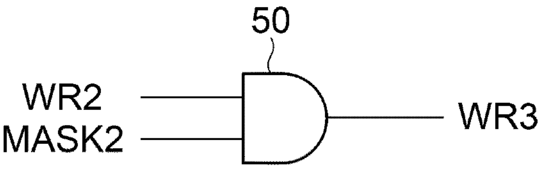
FIGS. 8A and 8B are circuit diagrams of the mask logic.
Figure 8B:
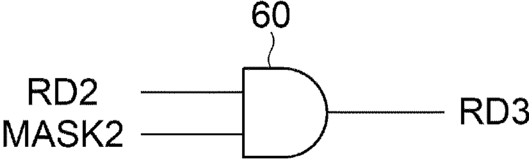

FIG. 8A is a circuit diagram of the mask logic 50. FIG. 8B is a circuit diagram of the mask logic 60. As shown in FIGS. 8A and 8B, the mask logics 50 and 60 are each configured by an AND gate circuit. The mask logic 50 generates the write command signal WR3 based on the write command signal WR2 and the mask signal MASK2. The mask logic 60 generates the read command signal RD3 based on the read command signal RD2 and the mask signal MASK2.

Figure 9A:
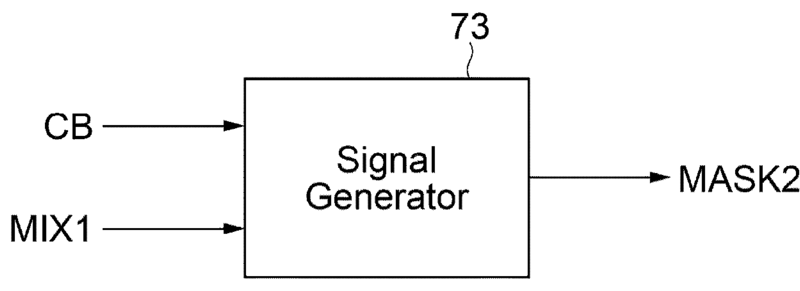
Figure 9B:
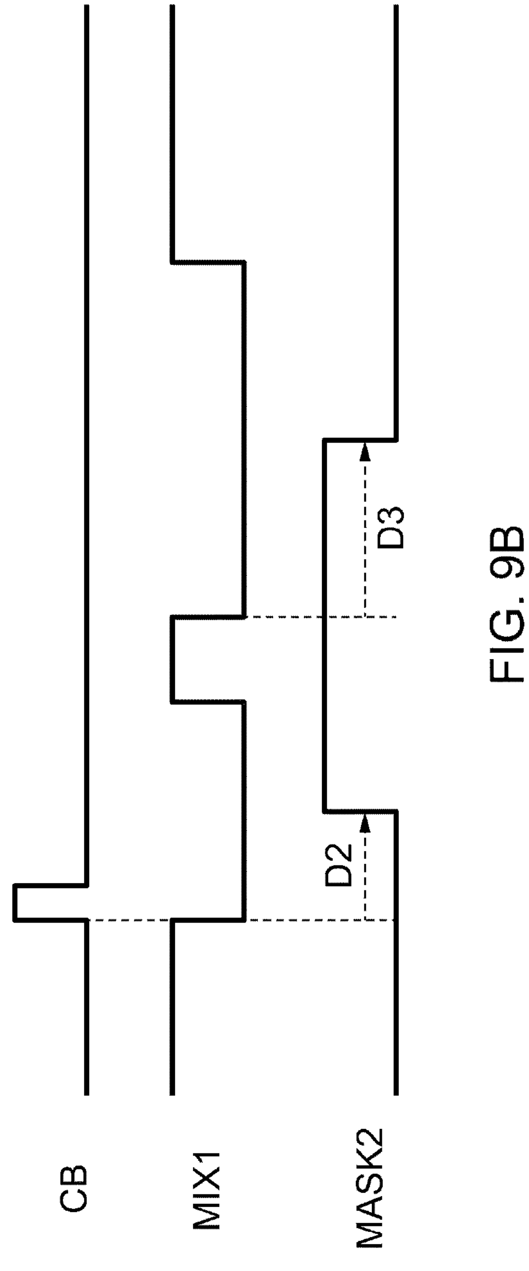

FIG. 9A is a block diagram of a signal generation circuit 73 that generates the mask signal MASK2. FIG. 9B is a timing chart for explaining the operation of the signal generation circuit 73. As shown in FIG. 9A, the signal generation circuit 73 generates the mask signal MASK2 based on the command burst signal CB and the mixed command signal MIX1. As shown in FIG. 9B, the mask signal MASK2 changes to be at a high level at a timing at which a predetermined delay time D2 has elapsed after activation of the command burst signal CB. The mask signal MASK2 then changes to be at a low level at a timing at which a predetermined delay time D3 has elapsed after change of the mixed command signal MIX1 from a high level to a low level.

Figure 10A:
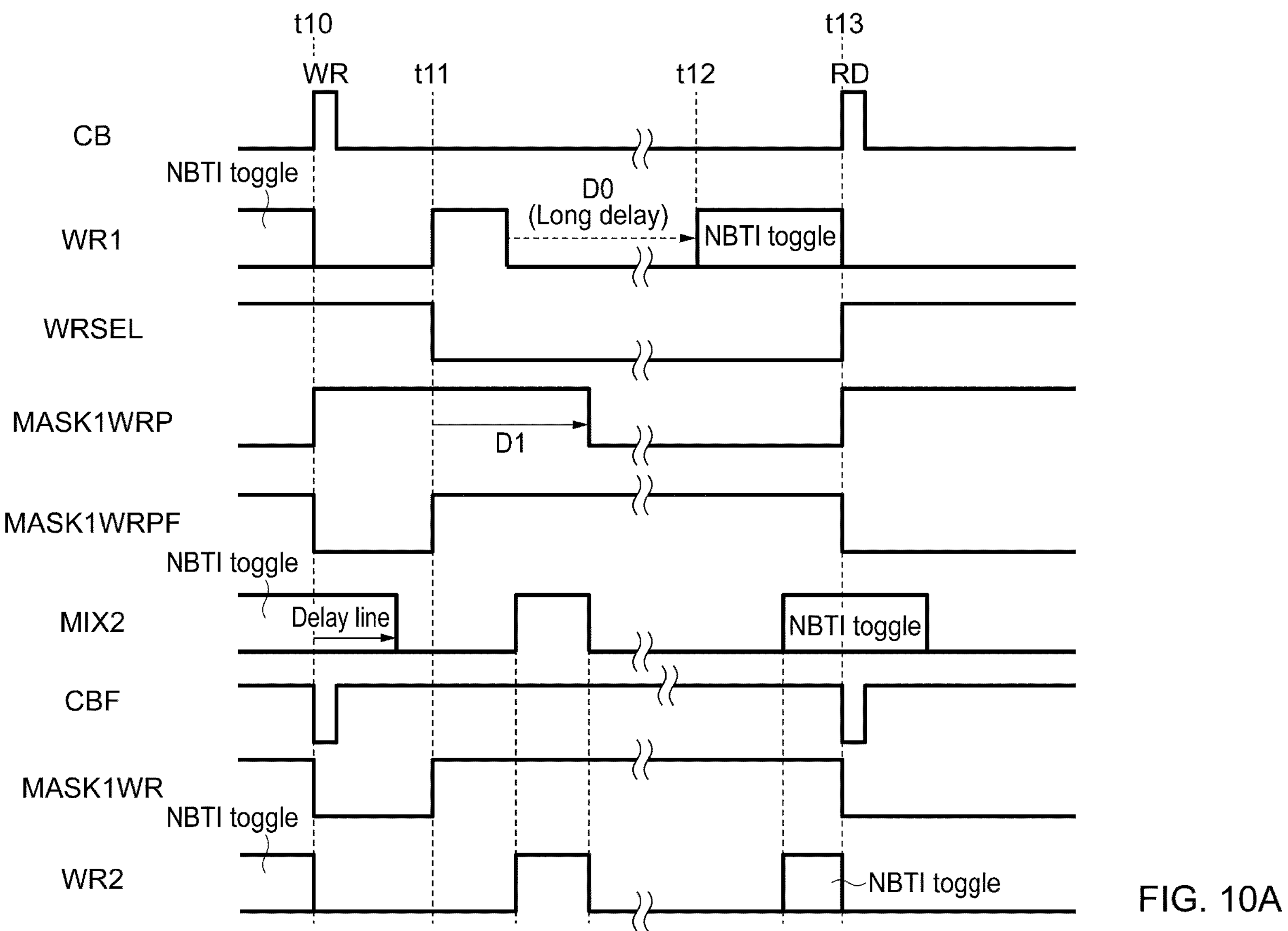
FIG. 10A is a timing chart for explaining the operation of the command selector.

FIG. 10A is a timing chart for explaining the operation of the command selector 30.

In the example shown in FIG. 10A, the command burst signal CB caused by a write command is activated at a time t10. During a period before the time t10, the toggle pattern signal TGL appears on a transmission path for the write command signal WR1. Accordingly, NBTI of a P-channel MOS transistor included in the transmission path for the write command signal WR1 is reduced. When the command burst signal CB is activated at the time t10, the toggle generation circuit 19 immediately interrupts generation of the toggle pattern signal TGL. Further, the write selection signal WRSEL output from the flip flop 31 is kept at a high level. Furthermore, the mask signal MASK1WRP output from the signal generation circuit 71 changes to be at a high level. In response to this change, the mask signals MASK1WRPF and MASK1WR change to be at a low level. During a period during which the mask signal MASK1WR is at a low level, the mixed command signal MIX2 is masked by the gate circuit 34. Therefore, during the period during which the mask signal MASK1WR is at a low level, the write command signal WR2 output from the command selector 30 is fixed at a low level.

When an original command caused by the command burst signal CB appears on the transmission path for the write command signal WR1 at a time t11, the write selection signal WRSEL output from the flip flop circuit 31 changes to be at a low level. In response to this change, the mask signals MASK1WRPF and MASK1WR change to be at a high level. During a period during which the mask signal MASK1WR is at a high level, the mixed command signal MIX2 is passed through the gate circuit 34. A period from the time t10 to the time t11 is a period during which the write command signal WR1 is masked by the command selector 30, and corresponds to the period from the time t1 to the time 14 shown in FIG. 3. When the predetermined delay time D1 elapses after change of the write selection signal WRSEL from a high level to a low level (at the time t11), the mask signal MASK1WRP changes to be at a low level. Accordingly, the mixed command signal MIX2 is passed through the gate circuit 34 during a period other than the period from the time t10 to the time t11. Then, at a timing when the predetermined delay time DO has elapsed after deactivation of the write command signal WR1, the toggle pattern signal TGL is generated again. The delay time DO is sufficiently longer than the delay time D3.

With the operation described above, the command selector 30 removes the toggle pattern signal TGL during a period immediately before the original write command signal WR1 caused by the command burst signal CB. In the example shown in FIG. 10A, the command burst signal CB caused by a read command is activated at a time t13. In response to this activation, the write selection signal WRSEL and the mask signal MASK1WRP change to be at a high level, and the mask signals MASK1WRPF and MASK1WR change to be at a low level.

The command selector 40 also performs the same operation as the command selector 30 described above except that the read command signal RD1 is used in place of the write command signal WR1 and the mask signal MASK1RDP is used in place of the mask signal MASK1WRP.

Figure 10B:
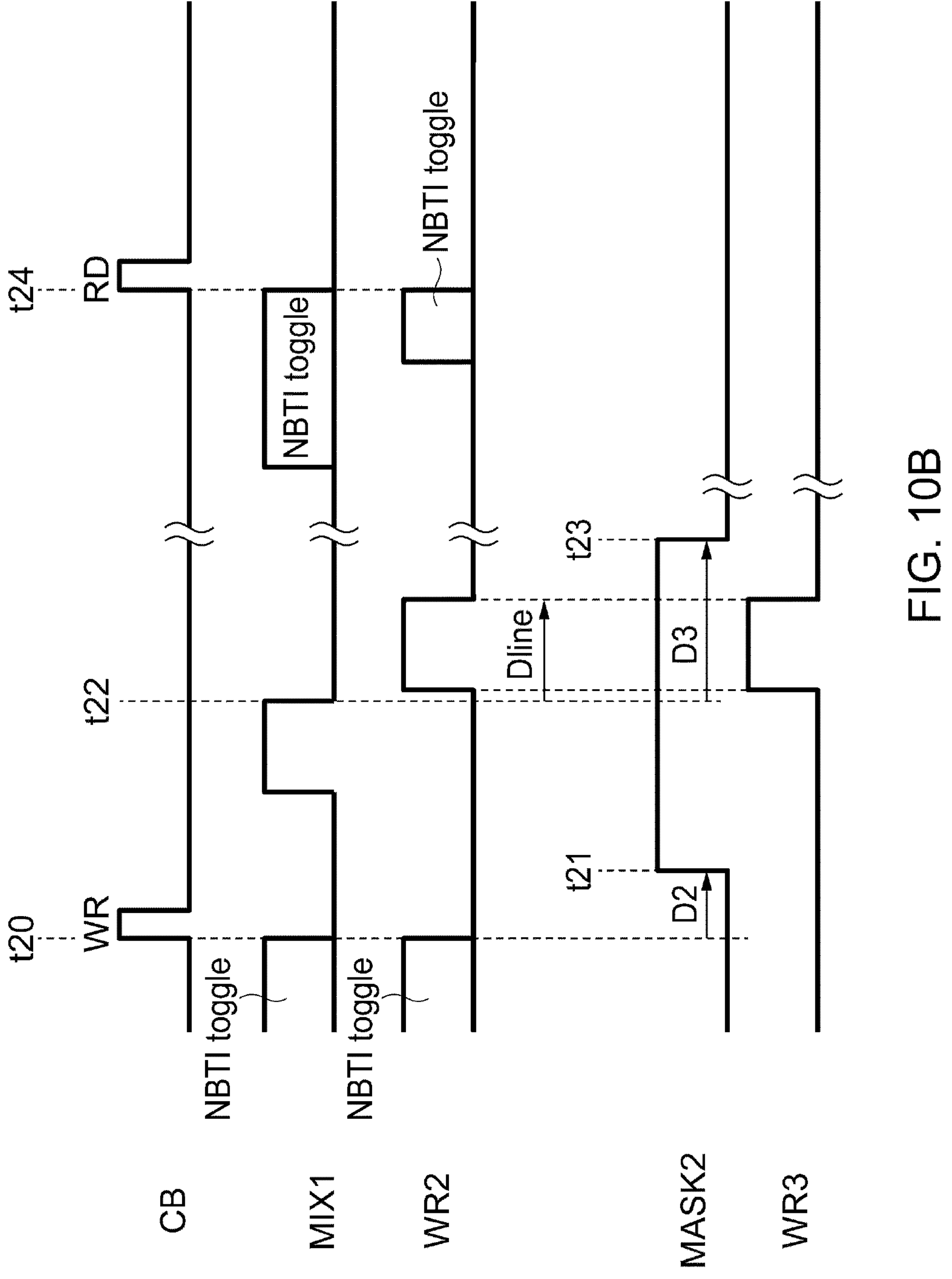
FIG. 10B is a timing chart for explaining the operation of the mask logic.

FIG. 10B is a timing chart for explaining the operation of the mask logic 50.

In the example shown in FIG. 10B, the command burst signal CB caused by a write command is activated at a time t20. In response to this activation, the toggle pattern signal TGL is removed from the mixed command signal MIX1 and the write command signal WR2, as described with reference to FIG. 10A. When the predetermined delay time D2 elapses (at a time t21) after activation of the command burst signal CB, the mask signal MASK2 changes to be at a high level. During a period during which the mask signal MASK2 is at a high level, the write command signal WR2 is passed through the mask logic 50. When the predetermined delay time D3 elapses (at a time t23) after change of the mixed command signal MIX1 from a high level to a low level at a time t22, the mask signal MASK2 changes to be at a low level. A period from the time t21 to the time t23 is a period during which the write command signal WR1 is passed through by the mask logic 50, and corresponds to a period from the time t2 to the time t5 shown in FIG. 3. During a period other than the period from the time t21 to the time t23, the write command signal WR2 is masked by the mask logic 50. In the example shown in FIG. 10B, the command burst signal CB caused by a read command is activated at a time t24. In response to this activation, the toggle pattern signal TGL is removed again from the mixed command signal MIX1 and the write command signal WR2.

The mask logic 60 also performs the same operation as the mask logic 50 described above except that the read command signal RD2 is used in place of the write command signal WR2.

As described above, in the semiconductor device 10 according to the present embodiment, a masking operation is stopped in response to the write command signal WR11 the read command signal RD1 before passing through the delay line 24. Therefore, it is not necessary to use a dedicated delay line for timing the masking operation. In addition, generation of the toggle pattern signal TGL is immediately stopped in response to the command burst signal CB, and masking of the mixed command signal MIX2 that has passed through the delay line 24 is immediately performed in response to the command burst signal CB. Therefore, a sufficient margin can be provided to the timing of release of masking by the mask logics 50 and 60. Further, since a two-step masking operation including a masking operation using the command selectors 30 and 40 and a masking operation using the mask logics 50 and 60 is performed, and a period for the first masking using the command selectors 30 and 40 is minimized, NBTI can be reduced more effectively.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:

a first circuit configured to generate a first internal command signal in response to receiving an external command;

a second circuit configured to receive the first internal command signal and a degradation control signal to generate a first mixed signal including a first internal command portion and a degradation control signal portion;

a third circuit configured to delay the first mixed signal to generate a second mixed signal; and a fourth circuit coupled to the third circuit, the fourth circuit being configured to:

receive the second mixed signal;

start masking the degradation control signal portion of the second mixed signal at a first timing after the external command is received; and stop masking the degradation control signal portion of the second mixed signal at a second timing after the first internal command portion is generated.

2. The apparatus of claim 1, wherein the fourth circuit is configured to generate a third mixed signal by masking the degradation control signal portion of the second mixed signal, wherein the apparatus further comprises a fifth circuit configured to generate a second internal command signal by masking the degradation control signal portion of the second mixed signal, wherein the fifth circuit is configured to:

start masking the degradation control signal portion of the second mixed signal at a third timing after the first internal command portion is deactivated; and stop masking the degradation control signal portion of the second mixed signal at a fourth timing after the external command is received.

3. The apparatus of claim 1, further comprising a sixth circuit configured to generate the degradation control signal, wherein the sixth circuit is configured to:

start generating the degradation control signal responsive to the first internal command portion; and stop generating the degradation control signal responsive to the external command.

4. The apparatus of claim 2, further comprising:

a memory cell array; and a data control circuit, wherein the data control circuit is configured to transfer a write data to the memory cell array responsive to the second internal command signal when the external command indicates a write operation.

5. The apparatus of claim 2, further comprising:

a memory cell array; and a data control circuit, wherein the data control circuit is configured to output a read data read from the memory cell array to outside responsive to the second internal command signal when the external command indicates a read operation.

6. The apparatus of claim 2, wherein the degradation control signal portion includes a first toggle pattern preceding the first internal command portion, and wherein at least a part of the first toggle pattern included in the second mixed signal is masked by the fourth circuit.

7. The apparatus of claim 6, wherein the degradation control signal portion further includes a second toggle pattern subsequent to the first internal command portion, and wherein the fifth circuit is configured to start masking the third mixed signal before the second toggle pattern included in the third mixed signal reaches the fifth circuit.

8. An apparatus comprising:

a first circuit configured to generate a first signal in which a first toggle pattern, a command pattern, and a second toggle pattern appear in this order;

a second circuit configured to mask the first signal to generate a second signal;

a third circuit configured to mask the second signal to generate a third signal, wherein the second circuit is configured to start masking the first signal at a first time preceding an end time of the first toggle pattern and stop masking the first signal at a second time between the end time of the first toggle pattern and the command pattern, and wherein the third circuit is configured to stop masking the second signal at a third time between the first time and the second time and start masking the second signal at a fourth time between the command pattern and a start time of the second toggle pattern.

9. The apparatus of claim 8, wherein the first circuit is configured to generate the first signal by delaying a fourth signal, and wherein the second time is defined by a start time of the command pattern included in the fourth signal.

10. The apparatus of claim 9, further comprising a fourth circuit configured to generate the fourth signal responsive to a fifth signal, wherein the first time is defined by the fifth signal.

11. The apparatus of claim 10, wherein the third time is defined by a timing at which a first period is elapsed after the fifth signal is activated.

12. The apparatus of claim 11, wherein the fourth time is defined by a timing at which a second period is elapsed after an end time of the command pattern included in the fourth signal.

13. The apparatus of claim 8, further comprising:

a memory cell array; and an I/O circuit, wherein the I/O circuit is configured to transfer a write data to the memory cell array responsive to the third signal when the command pattern indicates a write operation.

14. The apparatus of claim 8, further comprising:

a memory cell array; and an I/O circuit, wherein the I/O circuit is configured to output a read data read from the memory cell array to outside responsive to the third signal when the command pattern indicates a read operation.

15. An apparatus comprising:

a first circuit configured to generate a first signal including a command pattern and a plurality of dummy patterns;

a second circuit configured to generate a second signal by delaying the first signal; and a third circuit configured to mask the second signal to remove the plurality of dummy patterns to generate a third signal, wherein the third circuit is configured to stop masking the second signal when the command pattern included in the first signal is brought into an active state, and start masking the second signal when a first period is elapsed after the command pattern included in the first signal is brought into an inactive state.

16. The apparatus of claim 15, wherein the plurality of dummy patterns include a plurality of first dummy patterns that disappear before the command pattern appears, and wherein the third circuit is configured to stop masking the second signal after the plurality of first dummy patterns disappear and before the command pattern appears.

17. The apparatus of claim 16, wherein the plurality of dummy patterns further include a plurality of second dummy patterns that appear after the command pattern disappears, and wherein the third circuit is configured to start masking the second signal after the command pattern disappears and before the plurality of second dummy patterns appear.

18. The apparatus of claim 17, wherein the plurality of second dummy patterns appear when a second period is elapsed after the command pattern included in the first signal is brought into an inactive state.

19. The apparatus of claim 18, wherein the second period is longer than the first period.

20. The apparatus of claim 16, further comprising a fourth circuit configured to activate the command pattern responsive to an original command signal, wherein the plurality of first dummy patterns of the first signal stop responsive to the original command signal.

* * * * *